(12) United States Patent
Chen

(10) Patent No.: US 11,521,689 B2
(45) Date of Patent: Dec. 6, 2022

(54) NON-VOLATILE MEMORY AND OPERATION METHOD THEREOF AND ELECTRONIC DEVICE

(71) Applicant: GigaDevice Semiconductor Inc., Beijing (CN)

(72) Inventor: Minyi Chen, Beijing (CN)

(73) Assignee: GigaDevice Semiconductor Inc., Beijing (CN)

( * ) Notice: Subject to any disclaimer, the term of this patent is extended or adjusted under 35 U.S.C. 154(b) by 0 days.

(21) Appl. No.: 17/187,922

(22) Filed: Mar. 1, 2021

(65) Prior Publication Data

US 2022/0076758 A1 Mar. 10, 2022

(30) Foreign Application Priority Data

Sep. 4, 2020 (CN) .......................... 202010918881.0

(51) Int. Cl.
*G11C 16/16* (2006.01)
*G11C 16/34* (2006.01)
*G11C 16/26* (2006.01)
*G11C 16/30* (2006.01)
*G11C 16/08* (2006.01)

(52) U.S. Cl.
CPC .............. *G11C 16/16* (2013.01); *G11C 16/08* (2013.01); *G11C 16/26* (2013.01); *G11C 16/30* (2013.01); *G11C 16/3404* (2013.01)

(58) Field of Classification Search
CPC ......... G11C 16/06; G11C 16/08; G11C 16/26; G11C 16/30; G11C 16/3404
USPC ...................................... 365/185.29, 185.33
See application file for complete search history.

(56) References Cited

U.S. PATENT DOCUMENTS 7,411,819 B2 * 8/2008 Takeuchi ........... G11C 16/3459
365/185.17
10,825,532 B2 * 11/2020 Shim ..................... G11C 16/30

* cited by examiner

*Primary Examiner* — Son L Mai

(57) ABSTRACT

A non-volatile memory includes a plurality of blocks and a controller. Each of the plurality of blocks includes a plurality of pages, and each of the plurality of pages includes a plurality of storage units. The controller is configured to perform: receiving an erase command for a target block of the plurality of blocks; executing a read operation on each page of the target block; and executing a first erase operation to apply word line voltages to the plurality of pages, where the word line voltages are determined by a read result of the read operation of each page. An operation method of a non-volatile memory and an electronic device are also provided.

22 Claims, 7 Drawing Sheets

Second read operation

NON-VOLATILE MEMORY AND OPERATION METHOD THEREOF AND ELECTRONIC DEVICE

FIELD

The present disclosure relates to the memory, and more particularly to a non-volatile memory and an operation method thereof and an electronic device.

BACKGROUND

Data retention continues to be a critical reliability issue for flash memories, and the leakage is attributed to the high electric field from Fowler-Nordheim tunneling (FN tunneling) effect in an erase operation.

For example, some storage units in a block of a NAND flash memory are unprogrammed before being erased. Upon executing an erase operation, a high electric field poses high stress on these unprogrammed storage units. If the high electric field applied to the unprogrammed storage units could be reduced or avoided, the lifespan of the NAND flash memory would extend.

Consequently, there is a need to solve the above-mentioned problem in the existing art.

SUMMARY OF DISCLOSURE

The present disclosure provides a non-volatile memory and an operation method thereof and an electronic device.

A non-volatile memory provided by the present disclosure includes a plurality of blocks and a controller. Each of the plurality of blocks includes a plurality of pages, and each of the plurality of pages includes a plurality of storage units. The controller is configured to perform: receiving an erase command for a target block of the plurality of blocks; executing a read operation on each page of the target block; and executing a first erase operation to apply word line voltages to the plurality of pages, where the word line voltages are determined by a read result of the read operation of each page.

In an operation method of a non-volatile memory provided by the present disclosure, the non-volatile memory includes a plurality of blocks. Each of the blocks includes a plurality of pages, and each of the pages includes a plurality of storage units. The operation method of the non-volatile includes: receiving an erase command for a target block of the plurality of blocks; executing a read operation on each page of the target block; and executing a first erase operation to apply word line voltages to the plurality of pages, where the word line voltages are determined by a read result of the read operation of each page.

An electronic device provided by the present disclosure includes the non-volatile memory.

In the present disclosure, before the first erase operation is executed, the read operation is executed to determine the word line voltage to be applied to each page in the erase operation according to the state of each page. As such, a high electric field applied to the unprogrammed storage units can be reduced or avoided, and the lifespan of the non-volatile memory will extend.

DETAILED DESCRIPTION

Hereinafter, exemplary embodiments of the present disclosure will be described with reference to the accompanying drawings for illustrating specific embodiments which can be carried out by the present disclosure.

Figure 1:
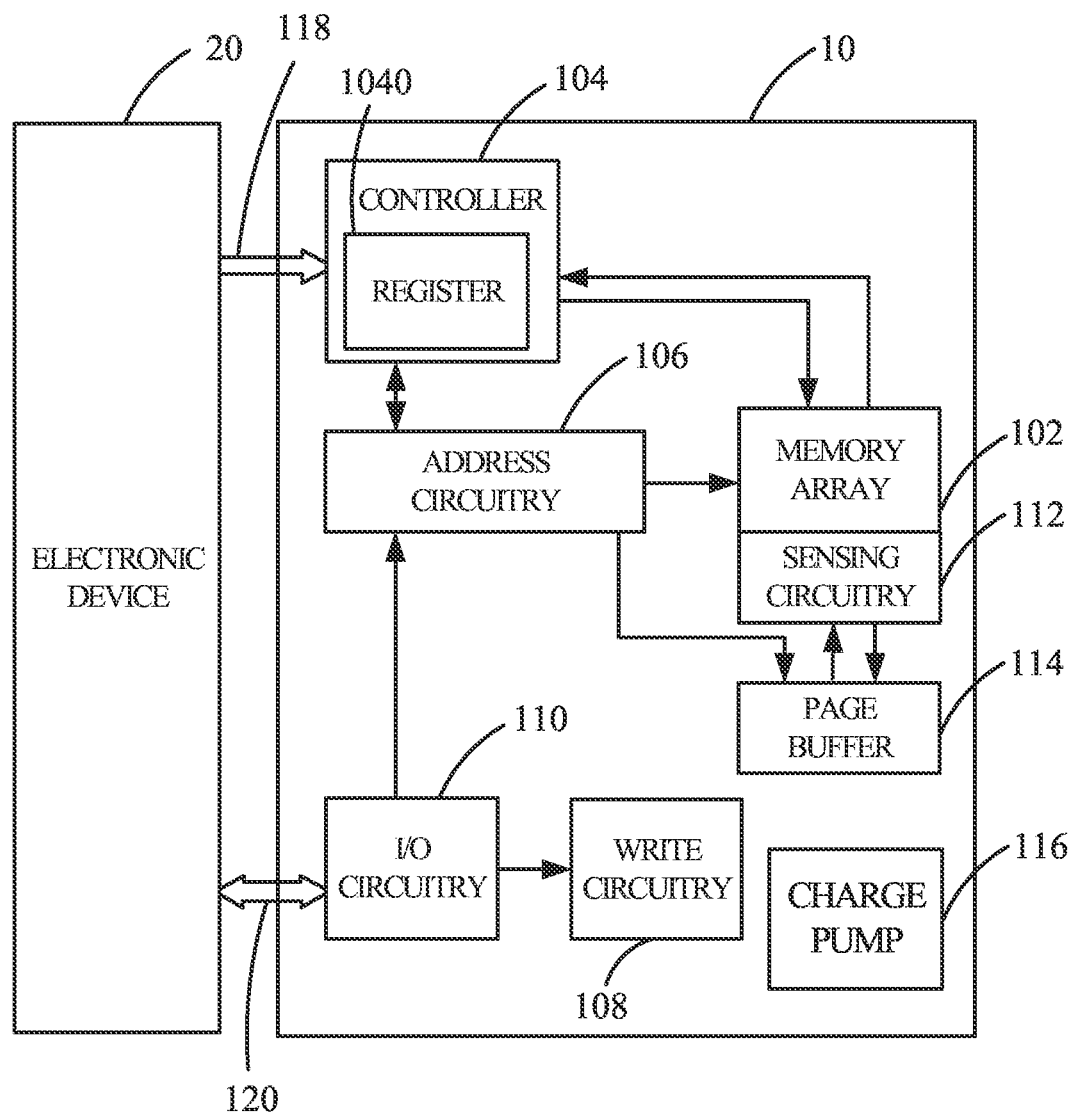
FIG. 1 illustrates a functional block diagram of a non-volatile memory in accordance with an embodiment of the present disclosure.
Figure 2:
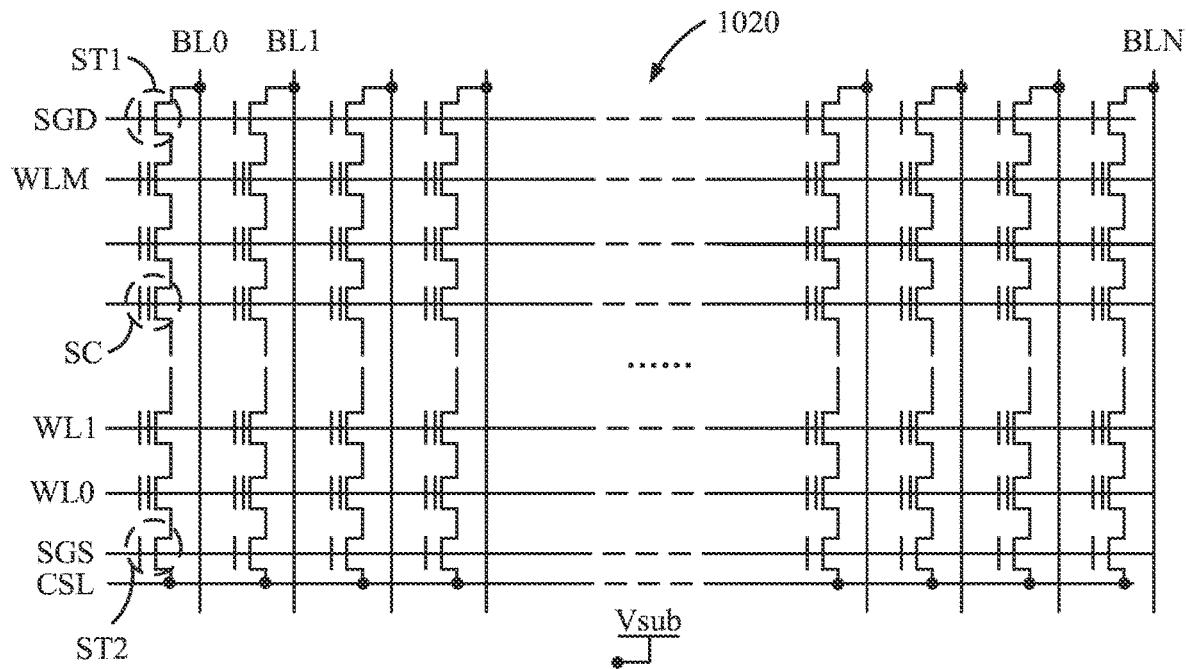
FIG. 2 illustrates a block of a memory array in FIG. 1.
Figure 3:
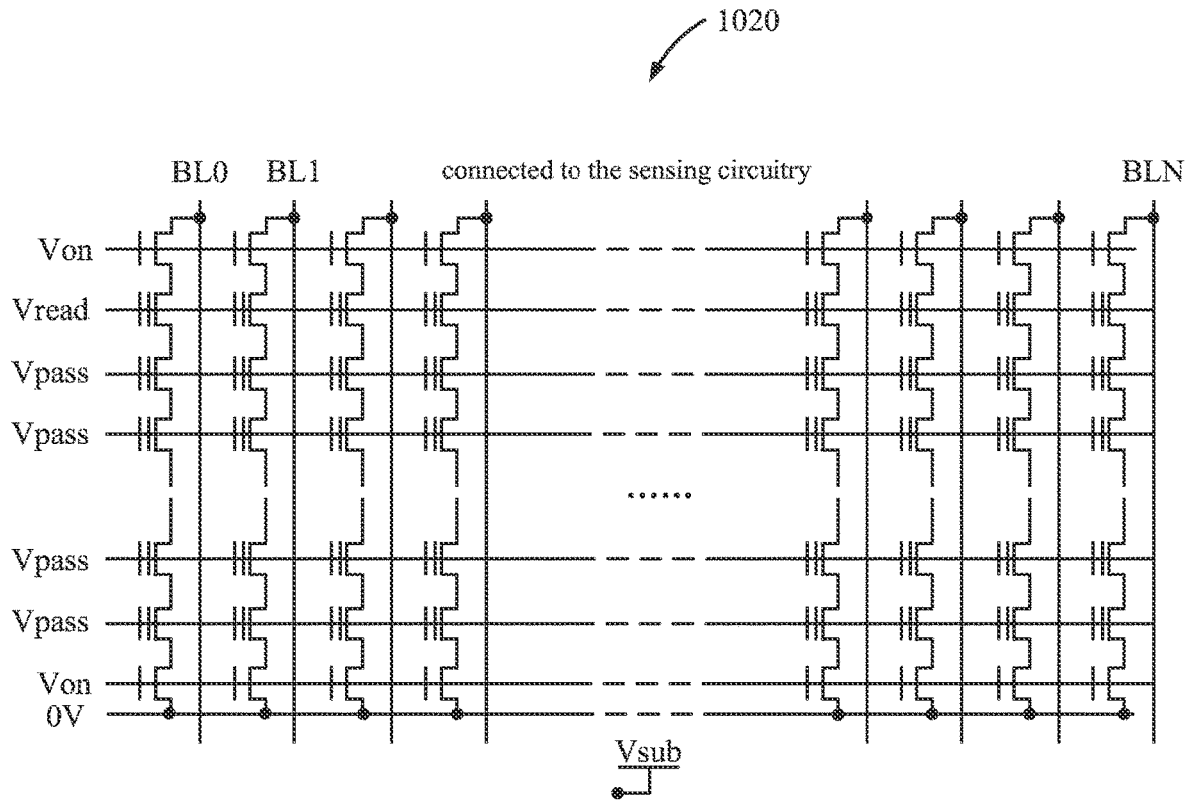
FIG. 3 illustrates a read operation in accordance with an embodiment of the present disclosure.
Figure 4:
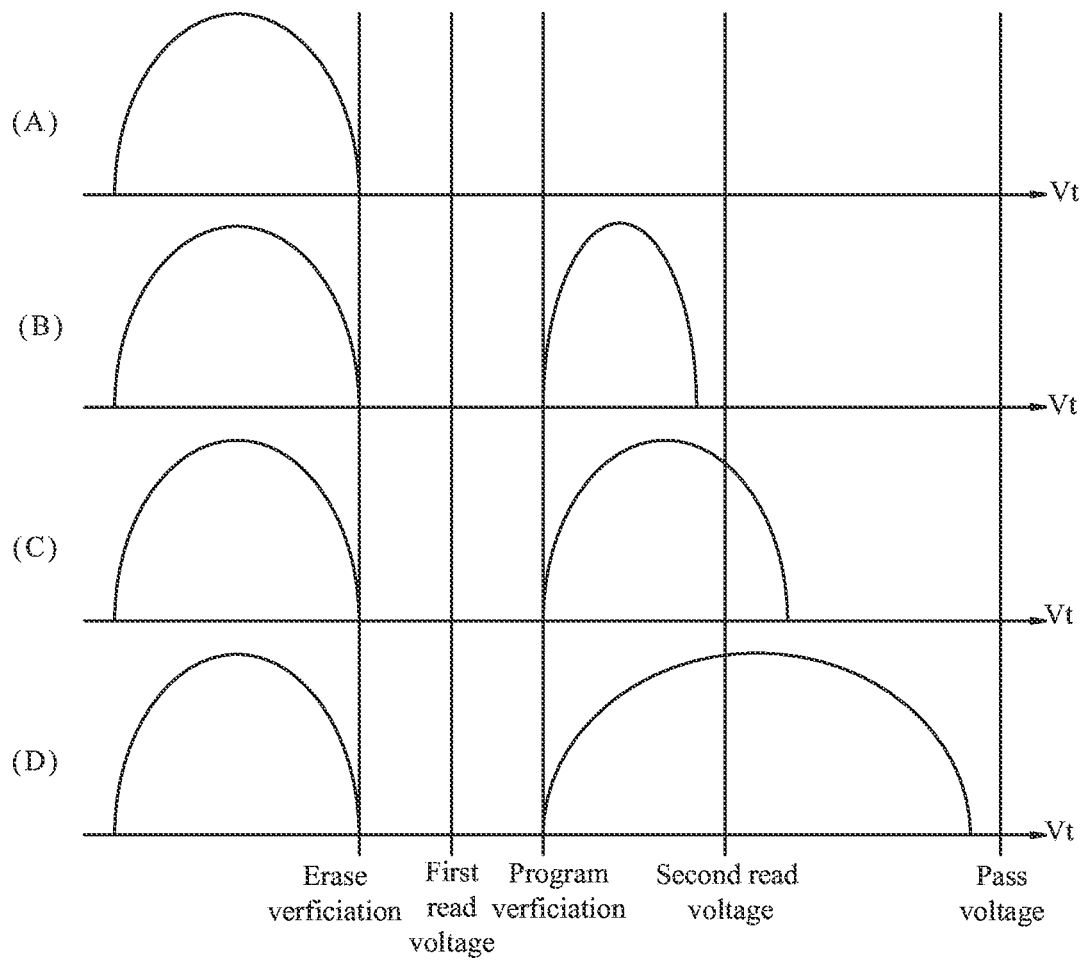
FIG. 4 illustrates various threshold voltage distributions of a page in accordance with an embodiment of the present disclosure.

Please refer to FIG. 1 to FIG. 4. FIG. 1 illustrates a functional block diagram of a non-volatile memory 10 in accordance with an embodiment of the present disclosure. FIG. 2 illustrates a block 1020 of a memory array 102 in FIG. 1. FIG. 3 illustrates a read operation in accordance with an embodiment of the present disclosure. FIG. 4 illustrates various threshold voltage distributions of a page in accordance with an embodiment of the present disclosure.

The non-volatile memory 10 is electrically connected to an electronic device 20. The non-volatile memory 10 is a built-in memory device or an external memory device. The non-volatile memory 10, for example, may be a universal serial bus drive, a portable storage device, a memory card and the like. The electronic device 20 is a user's device, for example, a mobile phone, a tablet, a notebook, a camera and the like. The non-volatile memory 10 can perform bidirectional data communication with the electronic device 20. A communication standard between the non-volatile memory 10 and the electronic device 20, for example, may be a serial advanced technology attachment (SATA) standard, a parallel advanced technology attachment (PATA) standard, a universal serial bus (USB) standard, a secure digital (SD) interface standard, a multimedia card (MMC) interface standard, a serial peripheral interface (SPI) standard and the like.

The non-volatile memory 10 includes the memory array 102, a controller 104, an address circuitry 106, a write circuitry 108, an input/output (I/O) circuitry 110, a sensing circuitry 112, a page buffer 114, and a charge pump 116. The non-volatile memory 10, for example, may be a NOR flash memory or a NAND flash memory. The following description is made by taking the NAND flash memory as an example.

The memory array 102 includes a plurality of blocks 1020 as shown in FIG. 2. Each block 1020 includes a plurality of storage units SC. In the embodiment shown in FIG. 2, the plurality of storage units SC are arranged in ((M+1) rows and (N+1) columns. The (M+1)*(N+1) storage units SC are formed, for example, in a common well.

Each storage unit SC, for example, is a transistor having a floating gate or a charge trapping layer. The storage units SC can be in a programmed state or an unprogrammed state (also referred to as an erase state). The storage units SC in the programmed state store data "0". The storage units SC in the unprogrammed state store data "1". In a write operation (also referred to as a program operation), a voltage applied to a control gate of one storage unit SC causes a tunnel current to pass a tunnel oxide layer, thereby injecting electrons into the floating gate. Accordingly, the floating gate is in a negative charge state representing a logical value "0". Data stored by the storage unit SC in the programmed state is set as "0". In an erase operation, a voltage applied to a substrate of one storage unit SC releases electrons stored in the floating gate, so that the floating gate is in a neutral state (or a positive charge state) representing a logical value "1". As such, data stored by the storage unit SC in the unprogrammed state is set as "1".

The storage units SC are addressed by word lines and bit lines. The storage units SC in each row are connected to the same word line. In detail, the control gates of the storage units SC in each row are connected to the same word line. In the same column of storage units SC, a source and a drain of two adjacent storage units SC are connected together. The storage units SC in the same column compose one storage string. A drain of a first one of the storage units SC in each storage string is connected to a bit line via a first selection transistor ST1, and a source of a last one of the storage units SC in each storage string is connected to a common source line CSL via a second selection transistor ST2. The storage units SC in the same row compose one page. (M+1) pages of the block 1020 are respectively connected to word lines WL0-WLM. Each page includes (N+1) storage units SC. The (N+1) storage units SC are respectively connected to bit lines BL0-BLN. Gates of the first selection transistors ST1 are all connected to a drain-side select gate line SGD. Gates of the second selection transistors ST2 are all connected to a source-side select gate line SGS. In detail, all storage units SC connected to the same word line together form one page. All pages connected to the word lines WL0-WLM together form one block 1020.

The controller 104 is configured to decode an instruction which is transmitted by the electronic device 20 via a control bus 118, execute the instruction of the electronic device 20, and/or access the memory array 102. The instruction is configured to execute an operation on the memory array 102. The operation at least includes a read operation, a write operation, an erase operation, and the like. For a NAND flash memory, an erase operation is executed in units of blocks, and a read operation and a write operation are executed in units of pages. The controller 104 includes a register 1040. It can be understood that the register 1040 can also be disposed outside the controller 104.

The address circuitry 106 is configured to latch address signals from the input/output circuitry 110 and decode the address signals to access the memory array 102. The electronic device 20 is configured to transmit the address signals to the input/output circuitry 110 via a data bus 120.

The write circuitry 108 is configured to execute a write operation. The sensing circuitry 122 is connected to the bit lines BL0-BLN and configured to execute a read operation. The page buffer 114 is configured to store data read from the memory array 102 and data to be written into the memory array 102. The page buffer 114, for example, may be a static random-access memory (SRAM). The page buffer 114 includes a plurality of units. The units correspond to the storage units SC of one page. The controller 104 is configured to determine, according to data in each page, word line voltages to be applied to the word lines WL0-WLM in an erase operation and store the determined word line voltages to be applied to the word lines WL0-WLM into the register 1040.

The charge pump 116 is configured to provide required voltages when a read operation, a write operation, or an erase operation is executed. For example, the charge pump 116 is configured to provide word line voltages for the word lines WL0-WLM and a substrate voltage (erase voltage) Vsub when an erase operation is executed.

In order to avoid a situation that a high electric field is applied to unprogrammed storage units when an erase operation is executed, the controller 104 of the present disclosure is configured to perform: receiving an erase command fort a target block (e.g., 1020 in FIG. 2) of the plurality of blocks; executing a read operation on each page of the target block 1020; and executing a first erase operation to apply the word line voltages to the plurality of pages, where the word line voltages are determined by a read result of the read operation of each page.

In detail, after receiving the erase command for the target block 1020, the controller 104 executes the read operation on each page of the target block 1020 and determines a state of each page according to the read result of the read operation of each page. Then, the controller 104 determines, according to a threshold voltage distribution of the storage units in each page, the word line voltage of each page which is required when the first erase operation is executed. Finally, the controller 104 executes the first erase operation according to the determined word line voltage of each page. In the present disclosure, before the first erase operation is executed, the read operation is executed to determine the word line voltage to be applied to each page according to the state of each page, thereby avoiding the situation that a high electric field is applied to unprogrammed storage units.

As shown in FIG. 3, the read operation is executed page-by-page. A read voltage Vread (e.g., 0.6V) is applied to the word line of one selected page. A pass voltage Vpass (e.g., 7V) is applied to the word lines of unselected pages. A turn-on voltage Von (e.g., 4V) is applied to the drain-side select gate line SGD and the source-side select gate line SGS. The bit lines BL0-BLN are connected to the sensing circuitry 112. Data of the selected page is read into the page buffer 114. Bit "1" read into one unit of the page buffer 114 represents that the storage unit SC corresponding to the one unit of the page buffer 114 is in an unprogrammed state. Bit "0" read into one unit of the page buffer 114 represents that the storage unit SC corresponding to the one unit of the page buffer 114 is in a programmed state. The controller 104 determines, according to the read result stored in the page buffer 114, the word line voltage to be applied to the selected page and stores the determined word line voltage into the register 1040. After the word line voltages of all pages of the target block 1020 are determined, the controller 104 executes the first operation on the target block 1020.

In one embodiment, the controller 104 executes one read operation on each page. In detail, a first read voltage (e.g., 0.6V) is applied to the word lines WL0-WLM of the plurality of pages of the target block 1020 sequentially to identify each of the plurality of pages as an unprogrammed page or a programmed page. One unprogrammed page represents that all of the storage units SC of the one page are in the unprogrammed state. That is, all the storage units SC store data "1". The unprogrammed state is also referred to as an erase state. One programmed page represents that the one page includes one or more storage units SC in the programmed state. That is, the programmed page includes one or more storage units SC storing data "0". It can be understood that some storage units SC or all storage units SC of the one programmed page are in the programmed state.

The controller 104 determines for each page the word line voltage to be used in the erase operation according to whether the page is an unprogrammed page or a programmed page. In detail, in the first erase operation, a substrate voltage (erase voltage) is applied to a substrate of the target block, a first word line voltage is applied to the word line of the unprogrammed page (FIG. 4A illustrates a threshold voltage distribution of the storage units SC of one unprogrammed page), and a second word line voltage is applied to the word line of the programmed page. The first word line voltage is greater than the second word line voltage. The first word line voltage, for example, may be approximately 5V-7V. The second word line voltage, for example, may be approximately 0V-1.5V.

The first word line voltage is greater than the second word line voltage. Accordingly, an electric field applied to tunnel oxide layers of the storage units SC in the unprogrammed state is less than an electric field applied to tunnel oxide layers of the storage units SC in the programmed state, and the lifespan of the non-volatile memory 10 extends.

In another embodiment, the controller 104 executes two read operations on the programmed page. In detail, the controller 104 applies a first read voltage (a first read operation) to the word lines WL0-WLM of the plurality of pages of the target block 1020 sequentially to identify each of the plurality of pages as an unprogrammed page or a programmed page.

After the first read operation is executed on the word lines WL0-WLM, a second read voltage (a second read operation) is applied to the word line of the programmed page to determine whether the programmed page includes a storage unit having a threshold voltage exceeding the second read voltage and to determine a number Y of the storage unit SC having the threshold voltages exceeding the second read voltage. The second read voltage is greater than the first read voltage.

When the threshold voltages of all of the storage units SC in the programmed page do not exceed the second read voltage (FIG. 4B illustrates an example of a threshold voltage distribution of the storage units SC of one programmed page in this situation), the second word line voltage is applied to the word line of such programmed page in the first erase operation. That is, when the number Y of the storage unit SC having the threshold voltage exceeding the second read voltage is zero, the second word line voltage is applied to the word line of such programmed page in the first erase operation.

In one embodiment, a number of the storage unit SC in the programmed state in the programmed page is X, and a ratio of Y to X is smaller than a predetermined ratio (FIG. 4C illustrates an example of a threshold voltage distribution of the storage units SC of one programmed page in this situation). A third word line voltage is applied to the word line of the programmed page in the first erase operation. When the ratio of Y to X is greater than or equal to the predetermined ratio (FIG. 4D illustrates an example of a threshold voltage distribution of the storage units SC of one programmed page in this situation), a fourth word line voltage is applied to the word line of the programmed page in the first erase operation. The third word line voltage, for example, may be approximately −1V-0V. The fourth word line voltage, for example, may be approximately −2V.

In another embodiment, in response to determination that the number Y of the storage unit SC having the threshold voltage exceeding the second read voltage in the programmed page is greater than 0 and less than a predetermined number, the third word line voltage is applied to the word line of the programmed page in the first erase operation. In response to determination that the number Y of the storage unit SC having the threshold voltage exceeding the second read voltage in the programmed page is greater than or equal to the predetermined number, the fourth word line voltage is applied to the word line of the programmed page.

In one embodiment, the predetermined number is determined according to a number of the storage unit SC in the target block 1020 or a number of the storage unit SC in each page. For example, for a page including 1024*8 storage units SC, the predetermined number is A1. For a page including 256*8 storage units SC, the predetermined number is A2.

In one embodiment, the predetermined number is equal to P/(1+M), where P is a total number of the storage unit SC having the threshold voltage exceeding the second read voltage in the target block 1020, and (1+M) is a number of the pages of the target block 1020. The controller 104 calculates, based on the second read operation of all programmed pages, the total number of the storage unit SC having the threshold voltage exceeding the second read voltage in the target block 1020. For example, in the memory as shown in FIG. 2, the total number P of the storage unit SC having the threshold voltage exceeding the second read voltage in the target block 1020 can be determined by the second read operation. The predetermined number is equal to P/(1+M). Alternatively, the predetermined number is a result of rounding up or down P/(1+M).

In one embodiment, the predetermined number is equal to P/Q, where P is the total number of the storage unit SC having the threshold voltage exceeding the second read voltage in the target block 1020, and Q is a number of pages in the target block 1020 including the storage unit SC having the threshold voltage exceeding the second read voltage. For example, in the target block 1020, there are Q pages including the storage unit SC having the threshold voltage exceeding the second read voltage. The total number of the storage unit SC having the threshold voltage exceeding the second read voltage in the target block 1020 is P. The predetermined number is P/Q. Alternatively, the predetermined number is a result of rounding up or down P/Q.

When the number of the storage unit SC in the programmed page having the threshold voltage exceeding the second read voltage is less than the predetermined number (as shown in FIG. 4C), the third word line voltage is approximately smaller than or equal to the word line voltage in an erase operation in the prior art, the electric field between the floating gates and the substrate is slightly enlarged and thus an erase speed is accelerated. When the number of the storage unit SC in the programmed page having the threshold voltage exceeding the second read voltage is larger than or equal to the predetermined number (as shown in FIG. 4D), the fourth word line voltage further enlarges the electric field between the floating gates and the substrate and thus the erase speed is further accelerated.

Figure 5:
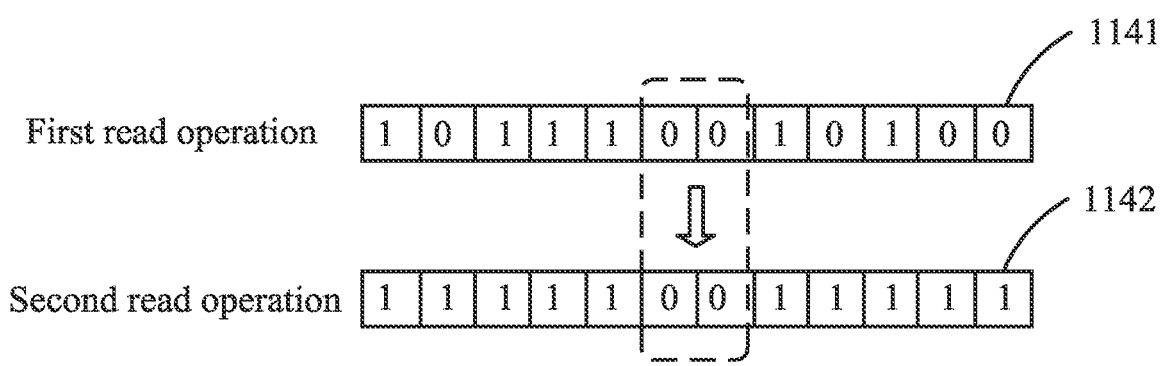
FIG. 5 illustrates that the read result of the first read operation and the read result of the second read operation are respectively stored into two page buffers in accordance with an embodiment of the present disclosure.

In some embodiments, the first read operation and the second read operation are executed on each page of the target block 1020. For example, the page buffer 114 includes page buffers 1141 and 1142 as shown in FIG. 5. The first read voltage is applied to the word line WL0, and a read result is stored into the page buffer 1141. Then, the second read voltage is applied to the word line WL0, and a read result is stored into the page buffer 1142. The controller 104 determines, based on the two read results, the word line voltage to be applied to the word line WL0 in the first erase operation and stores the word line voltage to be applied to the word line WL0 into the register 1040. The two read operations of the word lines WL1-WLM are the same as the two read operations of the word line WL0 and not repeated herein.

In other embodiments, the first read operation is executed first, and then it is determined whether to execute the second read operation according to the read result of the first read operation. In detail, when the first read operation shows that all the storage units SC in the page where the first read operation is performed are in the unprogrammed state, the second read operation is not executed. When the first read operation shows that the page where the first read operation is performed includes at least one storage unit SC in the programmed state, the second read operation is executed.

Figure 6:
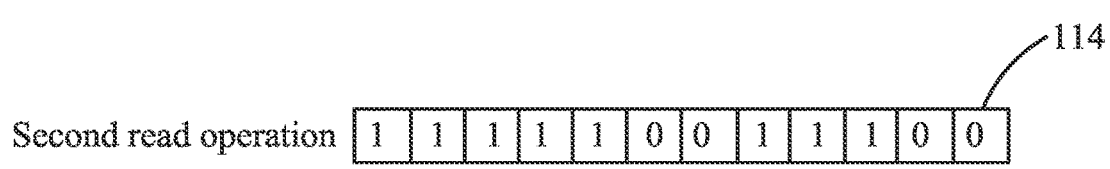
FIG. 6 illustrates that the read result of the first read operation is first stored into the page buffer and then the read result of the second read operation is stored into the page buffer in accordance with an embodiment of the present disclosure.

Furthermore, it is noted that the read result of the first read operation and the read result of the second read operation can be stored into two page buffers 1141 and 1142 or one page buffer 114. Please refer to FIG. 5 and FIG. 6. FIG. 5 illustrates that the read result of the first read operation and the read result of the second read operation are respectively stored into the two page buffers 1141 and 1142 in accordance with an embodiment of the present disclosure. FIG. 6 illustrates that the read result of the first read operation is first stored into the page buffer 141 and then the read result of the second read operation is stored into the page buffer 114 in accordance with an embodiment of the present disclosure.

For example, one page of the target block 1020 includes twelve storage units SC. Each of the storage units SC stores one bit of data. As shown in FIG. 5, in the first read operation, six bits are in the unprogrammed state ("1"). This means that the threshold voltages of the storage units SC corresponding to the six bits are smaller than the first read voltage. The other six bits are in the programmed state ("0"). This means that the threshold voltages of the storage units SC corresponding to the other six bits are greater than the first read voltage. In the second read operation, four bits are flipped from "0" to "1". This means that the threshold voltages of the storage units SC corresponding to the four bits are smaller than the second read voltage and greater than the first read voltage. Two bits remains unchanged ("0"). This means that the threshold voltages of the storage units SC corresponding to the two bits are greater than the second read voltage. Based on the read results of the two read operation stored in the page buffers 1141 and 1142, the storage units SC in the unprogrammed state, the storage units SC in the programmed state and with the threshold voltage smaller than the second read voltage, and the storage units SC in the programmed state and with the threshold voltage greater than the second read voltage can be determined.

As shown in FIG. 6, in the embodiment of only one page buffer 114, the read result of the first read operation is stored into the page buffer 114 to determine whether the read page is an unprogrammed page or a programmed page. Then, the page buffer 114 is cleared and the second read operation is executed. The read result of the second read operation is stored into the page buffer 114. As shown in FIG. 6, eight bits of the read result of the second read operation are in the unprogrammed state ("1"). This means that the threshold voltages of the storage units SC corresponding to the eight bits are smaller than the second read voltage. The threshold voltages of the storage units SC corresponding to the other four bits are greater than the second read voltage.

After the controller 104 executes the first erase operation according to the word line voltages in the register 1040, the controller 104 is further configured to perform: executing a verification operation for the first erase operation; and executing a second erase operation in response to failure of the first erase operation indicated by a verification result. In the second erase operation, the substrate voltage (erase voltage) Vsub applied to the target block 1020 is greater than the substrate voltage Vsub applied to the target block 1020 in the first erase operation.

In the verification operation, an erase verify voltage is sequentially applied to the word lines to execute a read operation on each page. A relationship of the erase verify voltage, the first read voltage, the second read voltage, and the pass voltage can be referred to FIG. 4A to FIG. 4D. The first read voltage is equal to a read voltage in a normal read operation.

In one embodiment, in the second erase operation, the second word line voltage is applied to the word lines WL0-WLM of the pages of the target block 1020. That is, a same voltage is applied to the word lines WL0-WLM of the plurality of pages of the target block 1020.

In another embodiment, in the second erase operation, the first word line voltage is applied to the word line of the page, which passes the verification operation, and the second word line voltage is applied to the word line of the page, which does not pass the verification operation. One page which passes the verification operation means that the threshold voltages of all the storage units SC in the one page are in a threshold voltage distribution of an erase state (refer to FIG. 4A). That is, all the storage units SC in the one page are in the erase state. One page which does not pass the verification operation means that the one page includes at least one storage unit SC outside the threshold voltage distribution of the erase state.

Figure 7:
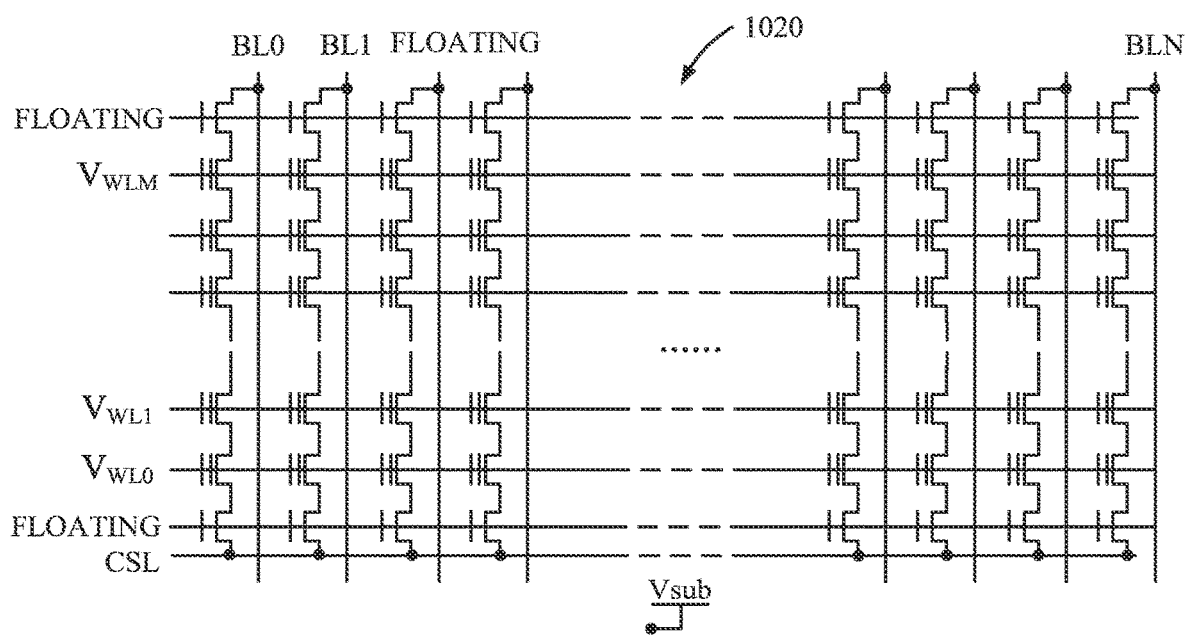
FIG. 7 illustrates an erase operation in accordance with an embodiment of the present disclosure.

Please refer to FIG. 7. FIG. 7 illustrates an erase operation in accordance with an embodiment of the present disclosure.

In the erase operation, the drain-side select gate line SGD, the source-side select gate line SGS, and the bit lines BL0-BLN are floating. A substrate voltage (e.g., 20V) is applied to the substrate. A word line voltage $V_{WL0}$ which is determined after the read operation or operations is applied to the word line WL0. A word line voltage $V_{WL1}$ which is determined after the read operation or operations is applied to the word line WL1. A word line voltage $V_{WLM}$ which is determined after the read operation or operations is applied to the word line WLM. The word line voltage of each of the word lines WL0-WLM which is determined after the read operation or operations is one of the first word line voltage, the second word line voltage, the third word line voltage, and the fourth word line voltage.

Figure 8:
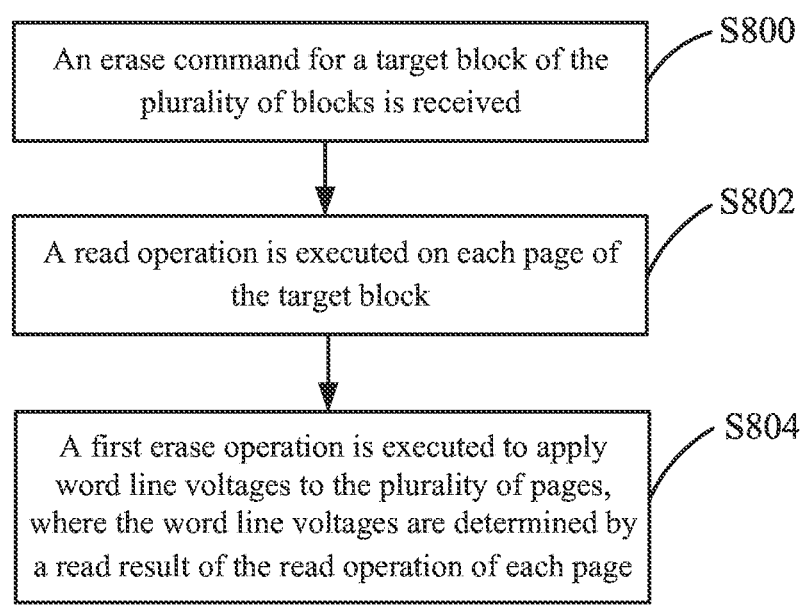
FIG. 8 illustrates a flowchart of an operation method of a non-volatile memory in accordance with an embodiment of the present disclosure.

Please refer to FIG. 8. FIG. 8 illustrates a flowchart of an operation method of a non-volatile memory in accordance with an embodiment of the present disclosure.

The non-volatile memory includes a plurality of blocks. Each of the blocks includes a plurality of pages. Each of the pages includes a plurality of storage units. The operation method of the non-volatile includes the following operations.

In operation S800, an erase command for a target block of the plurality of blocks is received.

In operation S802, a read operation is executed on each page of the target block.

In operation S804, a first erase operation is executed to apply word line voltages to the plurality of pages, where the word line voltages are determined by a read result of the read operation of each page.

In the operation method of the non-volatile memory of the present disclosure, before the first erase operation is executed, the read operation is executed to determine the word line voltage to be applied to each page according to the state of each page. A low electric field is applied to the unprogrammed page to extend the lifespan of the non-volatile memory. A high electric field is applied to the page including a predetermined number or more of storage units having a high threshold voltage, thereby accelerating the erase speed.

In one embodiment, one read operation is executed. In detail, a first read voltage is applied to word lines of the plurality of pages of the target block sequentially to identify each of the plurality of pages as an unprogrammed page or a programmed page.

In the first erase operation, a first word line voltage is applied to the word line of the unprogrammed page, and a second word line voltage is applied to the word line of the programmed page. The first word line voltage is greater than the second word line voltage.

In another embodiment, two read operations are executed. In detail, the first read voltage (a first read operation) is applied to the word lines of the plurality of pages of the target block to identify each of the plurality of pages as an unprogrammed page or a programmed page.

A second read voltage (a second read operation) is applied to the word line of the programmed page to determine whether the programmed page includes a storage unit having a threshold voltage exceeding the second read voltage and to determine a number Y of the storage unit having the threshold voltage exceeding the second read voltage.

The second word line voltage is applied to the word line of the programmed page when threshold voltages of all storage units in the programmed page do not exceed the second read voltage.

In one embodiment, a third word line voltage is applied to the word line of the programmed page, when a number of the storage unit in the programmed state in the programmed page is X and a ratio of Y to X (Y/X) is smaller than a predetermined ratio (as shown in FIG. 4C). A fourth word line voltage is applied to the word line of the programmed page, when the ratio of Y to X is greater than or equal to the predetermined ratio (as shown in FIG. 4D).

In another embodiment, the third word line voltage is applied to the word line of the programmed page, when the number Y of the storage unit having the threshold voltage exceeding the second read voltage in the programmed page is greater than 0 and less than a predetermined number. The fourth word line voltage is applied to the word line of the programmed page, when the number Y of the storage unit having the threshold voltage exceeding the second read voltage in the programmed page is greater than or equal to the predetermined number.

In one embodiment, the predetermined number is determined according to a number of the storage unit in the target block or a number of the storage unit in each page.

In one embodiment, the predetermined number is a quotient of a total number of the storage unit in the target block having a threshold voltage exceeding the second read voltage divided by a number of the plurality of pages of the target block.

In one embodiment, the predetermined number is a quotient of the total number of the storage unit in the target block having the threshold voltage exceeding the second read voltage divided by a number of pages in the target block including the storage unit having a threshold voltage exceeding the second read voltage.

Figure 9:
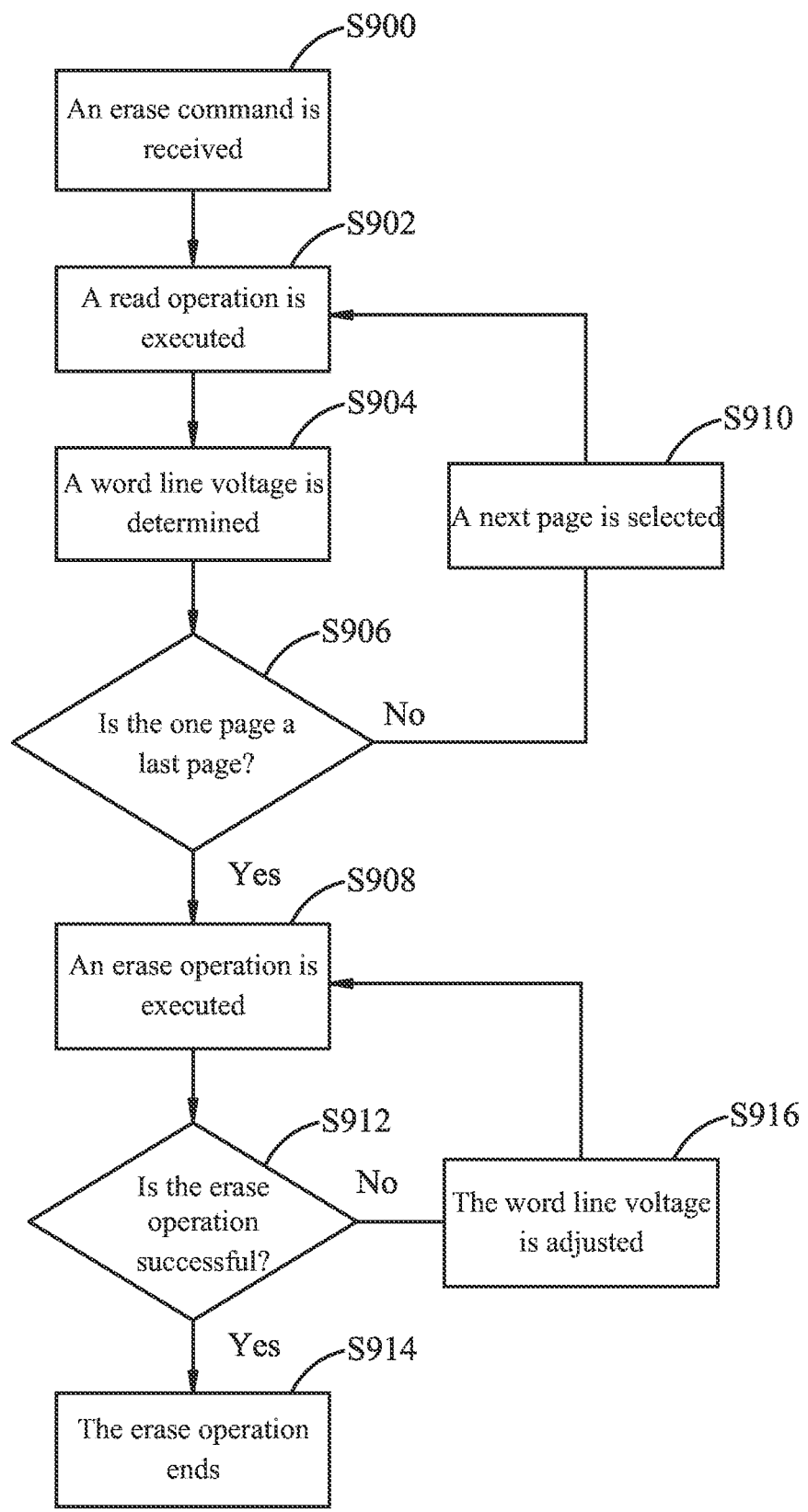
FIG. 9 illustrates a detailed flowchart of an operation method of a non-volatile memory in accordance with an embodiment of the present disclosure.

Please refer to FIG. 9. FIG. 9 illustrates a detailed flowchart of an operation method of a non-volatile memory in accordance with an embodiment of the present disclosure.

In operation S900, an erase command for a target block of the plurality of blocks is received.

In operation S902, a read operation is executed on one page of the target block.

In operation S904, a word line voltage of the one page is determined by a read result of the read operation of the one page.

In operation S906, it is determined whether the one page is a last page. If the one page is the last page, the method proceeds to operation S908. If the one page is not the last page, the method proceeds to operation S910.

In operation S908, an erase operation is executed. In the erase operation, a substrate voltage (erase voltage) is applied to a substrate of the target block, and the word line voltage determined in operation S904 is applied to the word line of the corresponding page.

In operation S910, a next page is selected. Then, the method proceeds to operation S902.

In operation S912, it is verified whether the erase operation is successful. If the verification result shows that the erase operation is successful, the method proceeds to operation S914. If the verification result shows that the erase operation is unsuccessful, the method proceeds to operation S916.

In operation S914, the erase operation ends.

In operation S916, the word line voltage of each page is adjusted. Next, the method proceeds to operation S908, and in this erase operation, the adjusted word line voltages are used.

In the present embodiment, when the erase operation is unsuccessful, the word line voltage of each page is adjusted according to a verification result of the erase operation and then an erase operation is executed again.

The erase voltage applied to the substrate of the target block in the present erase operation is greater than the erase voltage applied to the substrate of the target block in the previous erase operation.

In one embodiment, in the second erase operation, a second word line voltage is applied to all of the word lines of the plurality of pages of the target block. That is, a same voltage is applied to the word lines of the plurality of pages of the target block.

In another embodiment, in the second erase operation, a first word line voltage is applied to the word line of the page, which passes the verification, and the second word line voltage is applied to the word line of the page, which does not pass the verification.

Figure 10:
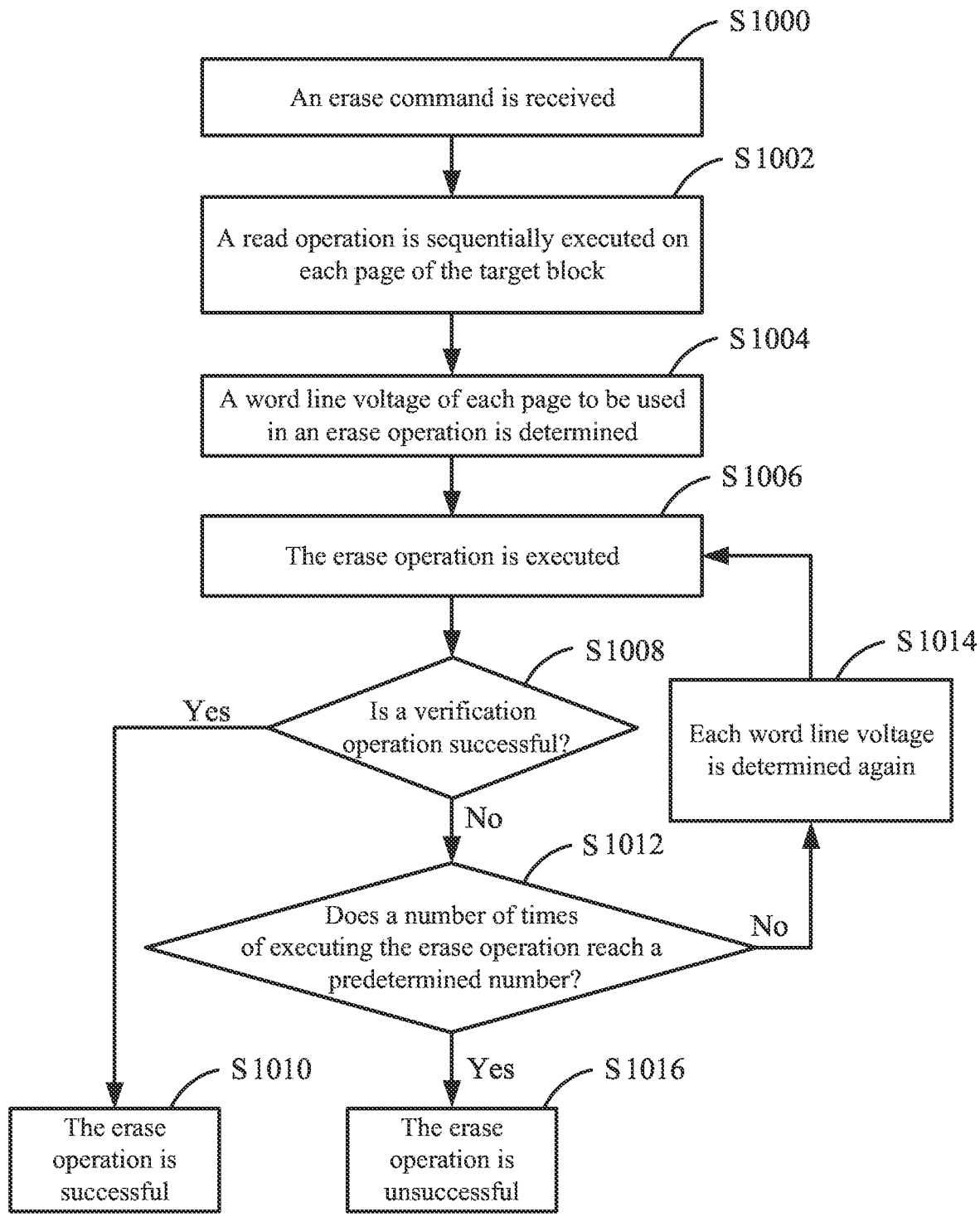
FIG. 10 illustrates a detailed flowchart of an operation method of a non-volatile memory in accordance with another embodiment of the present disclosure.

FIG. 10 illustrates a detailed flowchart of an operation method of a non-volatile memory in accordance with another embodiment of the present disclosure. In operation S1000, a controller receives an erase command and determines a target block of the erase command. In operation S1002, a read operation is sequentially executed on each page of the target block. The read operation can be referred to FIG. 3. In operation S1004, the controller determines, according to a read result of the read operation of each page, a word line voltage of each page to be used in an erase operation.

In some embodiments, each page is identified as an unprogrammed page or a programmed page by a read operation using a first read voltage. In the erase operation, a first word line voltage is applied to the word line of the unprogrammed page, and a second word line voltage is applied to the word line of the programmed page.

In some embodiments, each page is identified as an unprogrammed page or a programmed page by a read operation using a first read voltage. Then, the programmed page is further identified as a first programmed page, a second programmed page, or a third programmed page by another read operation using a second read voltage. The first programmed page does not include any storage unit having a threshold voltage exceeding the second read voltage. In the second programmed page, a number of the storage unit having a threshold voltage exceeding the second read voltage is less than a predetermined number. Alternatively, in the second programmed page, a ratio of the number of the storage unit having the threshold voltage exceeding the second read voltage to a number of the storage unit in a programmed state is smaller than a predetermined ratio. In the third programmed page, the number of the storage unit having the threshold voltage exceeding the second read voltage is greater than or equal to the predetermined number. Alternatively, in the third programmed page, a ratio of the number of the storage unit having the threshold voltage exceeding the second read voltage to the number of the storage unit in the programmed state is greater than or equal to the predetermined ratio. In operation S1006, the erase operation is executed on the target block according to the word line voltages determined in operation S1004. The erase operation can be referred to FIG. 7. In the erase operation, the first word line voltage is applied to the word line of the unprogrammed page, the second word line voltage is applied to the word line of the first programmed page, a third word line voltage is applied to the word line of the second programmed page, and a fourth word line voltage is applied to the word line of the third programmed page. The first word line voltage, for example, may be approximately 5V-7V. The second word line voltage, for example, may be approximately 0V-1.5V. The third word line voltage, for example, may be approximately −1V-0V. The fourth word line voltage, for example, may be approximately −2V. Therefore, the electric field in the unprogrammed page is less than the electric field in the first programmed page, the electric field in the first programmed page is less than the electric field in the second programmed page, and the electric field in the second programmed page is less than the electric field in the third programmed page.

In operation S1008, the controller executes a verification operation for the erase operation. In operation S1010, the erase operation is successful when the verification operation shows that all storage units in the target block are in the erase state or the number of the storage unit not in the erase state in the target block is less than a criteria number. In operation S1012, the controller determines whether a number of times of executing the erase operation reaches a predetermined number. In operation S1014, when the number of times of executing the erase operation does not reach the predetermined number, the controller increases an erase voltage applied to a substrate of the target block, determines each word line voltage of the target block again, and executes a next erase operation (operation S1006). For example, in the next erase operation, a word line voltage of the word line of the page, which passes the verification operation, is the first word line voltage, a word line voltage of the word line of the page, which does not pass the verification operation, is the second word line voltage. In operation S1016, when the number of times of executing the erase operation reaches the predetermined number, the erase operation is unsuccessful.

Furthermore, the present disclosure further provides an electronic device. The electronic device includes the non-volatile memory of any one of the above-mentioned embodiments. It is noted that in FIG. 1, the non-volatile memory 10 is an external component of the electronic device 20. In another embodiment, the non-volatile memory 10 can be built in the electronic device 20.

In the non-volatile memory and the operation method thereof and the electronic device of the present disclosure, before the first erase operation is executed, the read operation is executed to determine the word line voltage to be applied to each page according to the state of each page. As such, a high electric field applied to the unprogrammed storage units can be reduced and avoided, and the lifespan of the non-volatile memory can extend.

In summary, although the present disclosure has been provided in the preferred embodiments described above, the foregoing preferred embodiments are not intended to limit the present disclosure. Those skilled in the art, without departing from the spirit and scope of the present disclosure, may make modifications and variations, so the scope of the protection of the present disclosure is defined by the claims.

What is claimed is:

1. A non-volatile memory, comprising:
a plurality of blocks, each of the plurality of blocks comprising a plurality of pages, and each of the plurality of pages comprising a plurality of storage units; and
a controller configured to perform:
receiving an erase command for a target block of the plurality of blocks;
executing a read operation on each page of the target block; and
executing a first erase operation to apply word line voltages to the plurality of pages, the word line voltages being determined by a read result of the read operation of each page;
wherein the executing the read operation on each page of the target block comprises:
applying a first read voltage to word lines of the plurality of pages of the target block sequentially to identify each of the plurality of pages as an unprogrammed page or a programmed page.

2. The non-volatile memory of claim 1, wherein the executing the first erase operation to apply the word line voltages comprises:
applying a first word line voltage to the word line of the unprogrammed page of the plurality of pages; and
applying a second word line voltage to the word line of the programmed page of the plurality of pages;
wherein the first word line voltage is greater than the second word line voltage.

3. The non-volatile memory of claim 1, wherein the executing the read operation on each page of the target block comprises:
applying a first read voltage to word lines of the plurality of pages of the target block to identify each of the plurality of pages as an unprogrammed page or a programmed page; and
applying a second read voltage to the word line of the programmed page to determine a number Y of the storage unit having a threshold voltage exceeding the second read voltage in the programmed page.

4. The non-volatile memory of claim 3, wherein the executing the first erase operation to apply the word line voltages to the plurality of pages comprises:
applying a first word line voltage to the word line of the unprogrammed page.

5. The non-volatile memory of claim 3, wherein the executing the first erase operation to apply the word line voltages to the plurality of pages comprises:
applying a second word line voltage to the word line of the programmed page in response to determination that the number Y of the storage unit having the threshold voltage exceeding the second read voltage in the programmed page is zero.

6. The non-volatile memory of claim 3, wherein the executing the first erase operation to apply the word line voltages to the plurality of pages comprises:
applying a third word line voltage to the word line of the programmed page in response to determination that the number Y of the storage unit having the threshold voltage exceeding the second read voltage in the programmed page is greater than 0 and less than a predetermined number.

7. The non-volatile memory of claim 3, wherein the executing the first erase operation to apply the word line voltages to the plurality of pages comprises:
applying a fourth word line voltage to the word line of the programmed page in response to determination that the number Y of the storage unit having the threshold voltage exceeding the second read voltage in the programmed page is greater than or equal to a predetermined number.

8. The non-volatile memory of claim 6, wherein the predetermined number is a quotient of a total number of the storage unit in the target block having a threshold voltage exceeding the second read voltage divided by a number of the plurality of pages of the target block.

9. The non-volatile memory of claim 6, wherein the predetermined number is a quotient of a total number of the storage unit in the target block having a threshold voltage exceeding the second read voltage divided by a number of the page of the plurality of pages comprising at least one storage unit having a threshold voltage exceeding the second read voltage.

10. The non-volatile memory of claim 1, wherein after the executing the first erase operation, the controller is further configured to perform:
executing a verification operation for the first erase operation; and
executing a second erase operation in response to failure of the first erase operation.

11. The non-volatile memory of claim 10, wherein in the second erase operation, a same word line voltage is applied to word lines of the plurality of pages of the target block.

12. The non-volatile memory of claim 10, wherein in the second erase operation, a first word line voltage is applied to a word line of the page, which passes the verification operation, and a second word line voltage is applied to the word line of the page, which does not pass the verification operation.

13. The non-volatile memory of claim 10, wherein a substrate voltage applied to the target block in the second erase operation is greater than a substrate voltage applied to the target block in the first erase operation.

14. An operation method of a non-volatile memory, the non-volatile memory comprising a plurality of blocks, each of the plurality of blocks comprising a plurality of pages, each of the plurality of pages comprising a plurality of storage units, and the operation method of the non-volatile memory comprising:
receiving an erase command for a target block of the plurality of blocks;
executing a read operation on each page of the target block; and
executing a first erase operation to apply word line voltages to the plurality of pages, the word line voltages being determined by a read result of the read operation of each page;
wherein the step of executing the read operation on each page of the target block comprises:
applying a first read voltage to word lines of the plurality of pages of the target block sequentially to identify each of the plurality of pages as an unprogrammed page or a programmed page.

15. The operation method of the non-volatile memory of claim 14, wherein the step of executing the first erase operation to apply the word line voltages to the plurality of pages comprises:
applying a first word line voltage to the word line of the unprogrammed page; and
applying a second word line voltage to the word line of the programmed page;
wherein the first word line voltage is greater than the second word line voltage.

16. The operation method of the non-volatile memory of claim 14, wherein the step of executing the read operation on each page of the target block comprises:
applying a first read voltage to word lines of the plurality of pages of the target block to identify each of the plurality of pages as an unprogrammed page or a programmed page; and
applying a second read voltage to the word line of the programmed page to determine a number Y of the storage unit having a threshold voltage exceeding the second read voltage in the programmed page.

17. The operation method of the non-volatile memory of claim 16, wherein the step of executing the first erase operation to apply the word line voltages to the plurality of pages comprises:
applying a first word line voltage to the unprogrammed page;
applying a second word line voltage to the word line of the programmed page in response to determination that the number Y of the storage unit having the threshold voltage exceeding the second read voltage in the programmed page is zero;
applying a third word line voltage to the word line of the programmed page in response to determination that the number Y of the storage unit having the threshold voltage exceeding the second read voltage in the programmed page is greater than 0 and less than a predetermined number; and
applying a fourth word line voltage to the word line of the programmed page in response to determination that the number Y of the storage unit having the threshold voltage exceeding the second read voltage in the programmed page is greater than or equal to the predetermined number.

18. The operation method of the non-volatile memory of claim 14, wherein after the executing the first erase operation, the operation method of the non-volatile memory further comprises:
executing a verification operation for the first erase operation; and executing a second erase operation in response to failure of the first erase operation.

19. The operation method of the non-volatile memory of claim 18, wherein in the second erase operation, a same word line voltage is applied to word lines of the plurality of pages of the target block.

20. The operation method of the non-volatile memory of claim 18, wherein in the second erase operation, a first word line voltage is applied to a word line of the page, which passes the verification operation, and a second word line voltage is applied to the word line of the page, which does not pass the verification operation.

21. The operation method of the non-volatile memory of claim 18, wherein a substrate voltage applied to the target block in the second erase operation is greater than a substrate voltage applied to the target block in the first erase operation.

22. An electronic device, comprising a non-volatile memory, wherein the non-volatile memory comprises:

a plurality of blocks, each of the plurality of blocks comprising a plurality of pages, and each of the plurality of pages comprising a plurality of storage units; and a controller configured to perform:

receiving an erase command for a target block of the plurality of blocks;

executing a read operation on each page of the target block; and executing a first erase operation to apply word line voltages to the plurality of pages, the word line voltages being determined by a read result of the read operation of each page;

wherein the executing the read operation on each page of the target block comprises:

applying a first read voltage to word lines of the plurality of pages of the target block sequentially to identify each of the plurality of pages as an unprogrammed page or a programmed page.

* * * * *